United States Patent [19]

Falckenberg et al.

[11] Patent Number: 4,505,221
[45] Date of Patent: Mar. 19, 1985

[54] DEVICE FOR ASYMMETRICALLY COATING A TAPE-SHAPED CARRIER BODY WITH SILICON FOR FURTHER PROCESSING INTO SOLAR CELLS

[75] Inventors: Richard Falckenberg, Unterhaching; Helmut Foell, Munich; Josef Grabmaier, Berg, all of Fed. Rep. of Germany

[73] Assignee: Siemens Aktiengesellschaft, Berlin & Munich, Fed. Rep. of Germany

[21] Appl. No.: 512,756

[22] Filed: Jul. 11, 1983

[30] Foreign Application Priority Data

Aug. 23, 1982 [DE] Fed. Rep. of Germany ....... 3231268

[51] Int. Cl.³ .......................... B05C 3/15; B05C 11/02
[52] U.S. Cl. ................................... 118/101; 118/401; 118/405; 118/DIG. 2
[58] Field of Search ....................... 427/74, 177, 434.2, 427/434.4, 397.7; 118/DIG. 2, 401, 404, 405, 101; 156/622, 624, DIG. 88, 619; 422/246, 249

[56] References Cited

U.S. PATENT DOCUMENTS

| 4,171,991 | 10/1979 | Lindmayer | 148/1.5 |
| 4,251,570 | 2/1981 | Zook | 427/74 |
| 4,252,861 | 2/1981 | Heaps et al. | 428/446 |

FOREIGN PATENT DOCUMENTS 3036104 4/1981 Fed. Rep. of Germany .
3010557 9/1981 Fed. Rep. of Germany .
2041781A 9/1980 United Kingdom ............... 422/246

OTHER PUBLICATIONS

Belouet, The Growth of Polysilicon Sheets on Carbon Substrates by the RAD Process, Electrochem. Meeting, St. Louis, U.S.A., 5/16/80, abstract No. 327, pp. 817–818.

Primary Examiner—Evan K. Lawrence
Attorney, Agent, or Firm—Hill, Van Santen, Steadman & Simpson

[57] ABSTRACT

Apparatus and method for asymmetrically coating a tape-shaped carrier body with crystallized silicon for further processing into solar cells. In an exemplary embodiment a carrier body in the form of a graphite mesh is to be drawn through a guide channel leading from the floor of a melt vat and is moistened by the melt. The silicon is caused to crystallize above the melt vat because of a temperature gradient generated at right angles relative to the path of the coated carrier body. The temperature gradient can, for example, be produced by means of single-sided heating, or by a plate-shaped body extending from the melt parallel to the carrier body, or by guide lips with upper boundaries exhibiting different heights and widths. The method and apparatus serve for the continuous manufacture of silicon tapes for solar cells.

6 Claims, 4 Drawing Figures

DEVICE FOR ASYMMETRICALLY COATING A TAPE-SHAPED CARRIER BODY WITH SILICON FOR FURTHER PROCESSING INTO SOLAR CELLS

BACKGROUND OF THE INVENTION

The present patent application relates to an apparatus for asymmetrically coating a tape-shaped carrier body with molten silicon for further processing into solar cells. An apparatus is used wherein a melt vat accepting the silicon melt is provided, exhibiting a channel in its bottom part for guiding the tape-shaped carrier body, said channel extending in the direction toward the melt surface, the tape-shaped carrier body wound on a supply reel below the melt vat being guided by said channel, then being moistened by the melt, and the coated carrier body then being wound onto a storage drum disposed above the melt vat in the area of the guide channel.

Coatings of carrier bodies with molten silicon are known, for example, from U.S. Pat. No. 4,171,991 or from the Abstract No. 327 by C. Belouet from the Electrochemical Meeting, St. Louis, U.S.A., May 11 through 16, 1980. Whereas, given the former method, a thick fabic comprised of graphite strands is drawn through a melt or is dipped into said melt and is completely moistened by it, given the latter reference a substrate consisting of a graphite plate is conducted through an opening situated in the floor of the melt crucible. The danger thereby exists that molten silicon will run out through the opening in the crucible floor and the and the coating will thereby be interrupted.

A method which can be executed given a device of the type initially cited can be derived from the German No. OS 30 10 557 A1. The possibility is provided by means of this device of manufacturing a planar silicon body with a high throughput (1 m²/min). A mesh carrier body consisting of graphite which is resistant to molten silicon and can be well-moistened by silicon is thereby surface-coated with molten silicon and is co-incorporated into the silicon body when the silicon crystallizes. If no special measures are undertaken, the carrier body is generally situated in the center of the planar silicon, i.e., the carrier body is symmetrically coated with silicon. For the following reasons, however, it has proven advantageous to coat the carrier body asymmetrically, i.e., to carry out the coating such that the carrier body is only coated at one side:

1. The employment of the silicon material is reduced to a minimum. Even given a thickness of the silicon layer of only 150 or, respectively, 200 $\mu$m, the carrier body, given a mesh thread thickness of 50 or, respectively, 100 $\mu$m, is outside of the effective part of the solar cell, i.e., outside of the cell area in which charge carriers are generated by means of light absorption (penetration depth 100 $\mu$m). Since the carrier body lies outside of the penetration depth of the light, no reduction of the efficiency due to "shadowing" occurs.
2. The carrier body can be directly incorporated in the back electrode.
3. The crystallization growth obstacles proceeding from the carrier body and negatively influencing the surface growth can be largely suppressed. Quasi-mono-crystalline surface growth can thereby be achieved, this having a favorable effect on the efficiency of the solar cell.

A method for drawing a polycrystalline silicon layer onto a carbonized ceramic substrate is known from the German No. OS 30 36 104 A1 wherein an asymmetrical coating of the substrate is achieved in that the substrate is withdrawn from the silicon melt in an attitude deviating from the vertical, whereby the heating ensues due to the lower, non-coated layer which is still immersed. As a result of conducting the carrier body obliquely up (angle relative to the vertical approximately 10°), an asymmetrical coating of the carrier body is achieved which, given a vertical guidance of the carrier body toward the top, as is the case given the method of the type initially cited, leads to a symmetrical coating. Oblique drawing of planar silicon, however, particularly when drawing with an after-heating zone which is indispensible given fast drawing and for a high crystal quality of the silicon, is very involved technically and problematical.

SUMMARY OF THE INVENTION

It is therefore an object of the invention to specify an apparatus with which as high as possible a throughput given low material consumption can be achieved unproblematically with simple means.

Given employment of a device similar to that disclosed in the German No. OS 30 10 557, this object is inventively resolved in that a temperature gradient is produced in the crystallization region of the molten silicon perpendicularly to the path of the coated carrier body. It thereby lies within the framework of the the inventive idea that the carrier body coated with silicon, preferably consisting of a network or mesh of graphite threads or of graphitized silica glass threads, is either heated on the one side and cooled on the other side in the crystallization region or is drawn from the silicon melt parallel to a plate-like body partly immersed in the melt which is well-moistenable by silicon and is thereby cooled at its side lying opposite the plate-shaped body.

Further details, particularly concerning the apparatus of the invention may be derived from the subclaims and the schematic FIGS. 1 through 4 on the accompanying drawing sheet as well as from their description; and other objects, features and advantages will be apparent from this detailed disclosure and from the appended claims.

BRIEF DESCRIPTION OF THE DRAWING

FIGS. 1, 3 and 4 show special devices for attaining a temperature gradient with a horizontal component in the crystallization region; whereas

DETAILED DESCRIPTION

Figure 1:
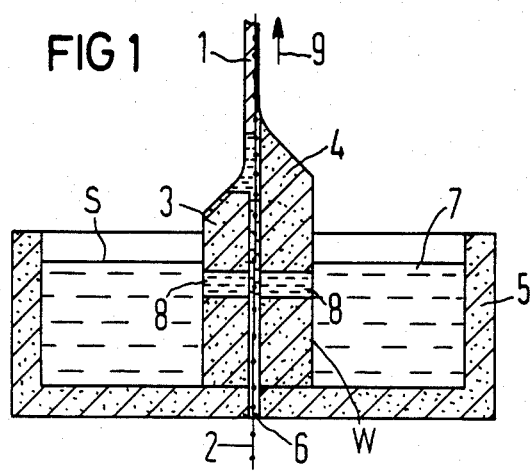

Identical reference numerals are employed for corresponding parts in all Figures.

Figure 2:
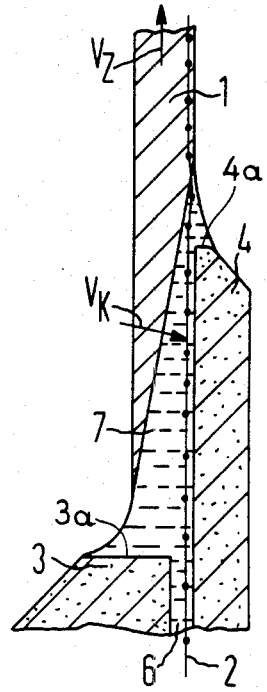
FIG. 2 is meant to illustrate the principle.

FIG. 1: A temperature gradient in the crystallization region perpendicular to the coated carrier body 1 which, before immersion into the melt 7 situated in a vat 5 consist of a graphite mesh 2, can be achieved when two lips 3 and 4 of the guide channel 6 proceeding through the floor part of the melt vat 5 are of different widths (at their uppermost boundaries 3a and 4a, FIG. 2) and lie at different heights relative to the melt surface S. The supply of the melt 7 ensues on account of capillary forces, from openings 8 in the walls W which define the supply channel 6. The walls W consist of graphite. The one (4) of the two lips 3 and 4 preferably terminates in a point at a height differential in the range of 2 through 6 mm above the surface (3a, FIG. 2) of the other of the lips. A one-sided radiation of heat is produced by means of this specific geometry, this being equivalent to a single-sided cooling. The necessary consequence is that the liquid silicon 7 crystallizes first on the side of the more deeply placed lip 3 of the feed channel 6 so as to predominantly coat the corresponding side of the tape-like graphite mesh 2 (v. FIG. 2 as well).

The wetting is carried out in the following manner: the tape-shaped graphite mesh 2 serving as carrier body is conducted through the channel 6 situated in the floor of the melt vat 5, being conducted toward the melt surface, and is moistened by the silicon melt 7 rising via the openings 8 in the channel, and is then withdrawn in the direction of arrow 9. The graphite mesh 2 can thereby be unwound from a supply reel below the vat 5 and the coated silicon band 1 can be rewound onto a storage drum above the melt. The melt 7 can be replenished with solid or liquid silicon by means of a lateral feed of the melt vat 5 so that the melt level always remains at a constant level in the melt vat 5. This transport principle is also described in the German No. OS 30 10 557. The same is also true of the drawing conditions (speed of transport of the mesh 2 in the direction of arrow 9, etc.).

FIG. 2: Illustrated here is how the silicon having the drawing rate $V_Z$ crystallizes first at the side of the silicon layer which faces away from the upper lip 4. Because of the temperature rise toward the upper lip 4, the further crystallization of the silicon in the direction toward the tape-shaped carrier body (1, 2) then ensues with the velocity $V_K << V_Z$.

Independently of one another, both lateral walls W of the channel 6 are respectively heated by means of direct current traversal or by means of external heaters (not illustrated) so that the higher lateral wall at lip portion 4 exhibits a higher temperature than the lower lateral wall at lip portion 3. The lateral walls W consist of a material which is well moistened by molten silicon (wetting angle $<<90°$); the minor cross-sectional dimension of the channel 6 is such that molten silicon 7 will rise in it toward the crystallization region as the result of capillary forces. Graphite having a wetting angle $\alpha = 30°$ is well-suited as a material for the walls W including lip portions 3, 4.

Figure 3:
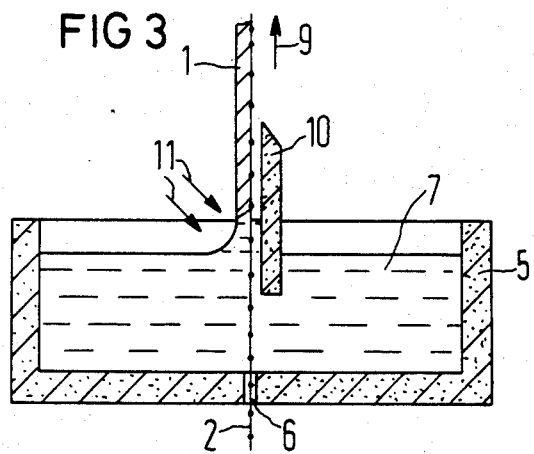

FIG. 3: An asymmetrical coating is also achieved when the carrier body 1 coated with silicon is drawn out of the melt 7 in the direction of arrow 9 parallel to a plate 10 which, for example, consists of graphite and which extends below the surface S so as to be partly immersed in the silicon melt 7 situated in the melt bath 5, whereby the carrier body consisting of the tape-shaped graphite mesh 2 is cooled, for example, by means of a blower (as represented by arrows 11), at the side lying opposite said graphite plate 10.

Figure 4:
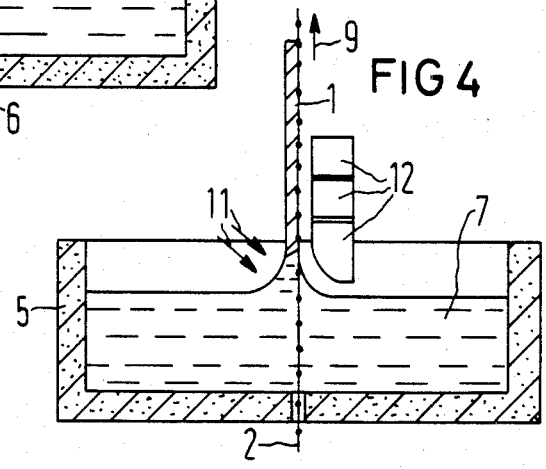

FIG. 4: A further possibility for asymmetrical coating consists, as illustrated here, of heating the carrier body 1 coated with molten silicon by means of heating devices 12 at one side and cooling it at the other side by means of blowing (as represented by arrows 11).

It will be apparent that many modifications and variations may be made without departing from the scope of the teachings and concepts of the present invention.

We claim as our invention:

1. Apparatus for asymmetrically coating a tape-shaped carrier body with crystallized silicon, for further processing into solar cells, said apparatus comprising a melt vat accepting a silicon melt, said silicon melt having a melt surface in said vat, said melt vat having a floor part underlying the silicon melt and having a channel for the guidance of a tape-shaped carrier body, said channel extending from the floor part of the vat up to above the surface of the silicon melt and having a tape-shaped carrier body supplied to said channel from below the floor part of said vat, and being removed from the channel above the melt vat after the tape-shaped carrier body has travelled through said channel, said channel having means comprising two lip portions extending to respective different heights relative to the melt surface at opposite sides of the tape-shaped carrier body at the upper end of the channel and defining a crystallization region where the molten silicon is crystallized to asymmetrically coat the tape-shaped carrier body, and means providing communication between the melt in the vat channel for supplying silicon from the melt to the crystallization region.

2. Apparatus according to claim 1, characterized in that a mesh of graphite threads or of graphitized silica glass threads is employed as the carrier body.

3. Apparatus according to claim 1 with the lip portion of lesser height above the melt surface having a greater width at its uppermost boundary while the other lip portion terminates in a tip at its uppermost boundary.

4. Apparatus according to claim 1, characterized in that one lip portion terminates in a tip toward the top and the height differential between the lip portions lies in the range of 2 through 6 mm.

5. Apparatus according to claim 1, characterized in that means are provided by which the two lip portions of the channel are heatable independently of one another.

6. Apparatus according to claim 1, characterized in that the guide channel is defined by graphite material.

* * * * *